United States Patent [19]

Manasevit

[11] 4,368,098

[45] Jan. 11, 1983

[54] EPITAXIAL COMPOSITE AND METHOD OF MAKING

[75] Inventor: Harold M. Manasevit, Anaheim, Calif.

[73] Assignee: Rockwell International Corporation, El Segundo, Calif.

[21] Appl. No.: 894,367

[22] Filed: Apr. 7, 1978

Related U.S. Application Data

[63] Continuation of Ser. No. 385,028, Aug. 2, 1973, abandoned, which is a continuation of Ser. No. 64,835, Oct. 1, 1969, abandoned, which is a continuation-in-part of Ser. No. 705,213, Feb. 13, 1968, abandoned.

[51] Int. Cl.³ .................... C30B 25/02; C30B 25/10; C30B 25/18; H01L 21/205
[52] U.S. Cl. .................................. 156/606; 156/610; 156/611; 156/612; 156/613; 156/614; 148/1.5; 148/175
[58] Field of Search .................. 148/175, 1.5; 357/4; 156/610–619, 606

[56] References Cited

U.S. PATENT DOCUMENTS

| | | | |
|---|---|---|---|
| 3,146,137 | 8/1964 | Williams | 148/175 |
| 3,218,205 | 11/1965 | Ruehrweir | 148/175 |
| 3,417,301 | 12/1968 | Galli | 148/175 |
| 3,424,955 | 1/1969 | Seiter | 148/175 |
| 3,433,684 | 3/1969 | Zorowick | 148/175 |
| 3,433,686 | 3/1969 | Marinace | 148/175 |
| 3,462,323 | 8/1969 | Grover | 148/175 |
| 3,476,593 | 11/1969 | Lehrer | 148/175 |
| 3,480,472 | 11/1969 | Dersin | 148/175 |
| 3,508,962 | 4/1970 | Manasevit | 148/175 |
| 3,674,552 | 7/1972 | Heyweng | 148/175 |
| 3,830,654 | 8/1974 | Cho | 148/175 |

OTHER PUBLICATIONS

*Handbook of Chemistry & Physics* 42nd Ed. (1961–1962) Chem. Rubber Pub. Co. pp. 2681–2697, 2700–2710.

*Primary Examiner*—John D. Smith
*Attorney, Agent, or Firm*—H. Fredrick Hamann; Harry John Staas

[57] ABSTRACT

An epitaxial composite comprising a thin film of single crystal Group III-V wide band-gap compound semiconductor or semiconductor alloy on single crystal, electrically insulating oxide substrates such as sapphire, spinel, BeO, $ThO_2$, or the like, and on III-V semiconductors or alloys. The thin film may be produced in situ on a heated substrate by reaction of an organic compound containing the Group III constituent, typically the alkyl metal organic, such as trimethylgallium and/or triethylgallium with a Group V hydride such as arsine, phosphine and/or stibine.

72 Claims, 3 Drawing Figures

FIG. 3

EPITAXIAL COMPOSITE AND METHOD OF MAKING

This is a continuation application, related as a divisional application to concurrently filed application Ser. No. 894,368, each thereof being respective continuations of and co-pending with U.S. Patent application Ser. No. 385,028, filed Aug. 2, 1973, now abandoned in turn a continuation of U.S. Patent application Ser. No. 64,835, filed Oct. 1, 1969, now abandoned which in turn is a continuation-in-part of U.S. Patent application Ser. No. 705,213 filed Feb. 13, 1968 abandoned.

BACKGROUND OF THE INVENTION

1. Field of Invention

The present invention relates to an epitaxial composite comprising a thin film of single crystal Group III–V compound semiconductor such as GaAs, GaP or $GaAs_{1-x}P_x$, $Ga_{1-y}Al_yAs$, $Ga_{1-y}In_yAs$, AlAs ... ; InAs ... and other solutions thereof on a single crystal, electrically insulating substrate. The invention also relates to a process for producing in situ the heteroepitaxial composite by reaction of an appropriate organic compound of the Group III constituent of the semiconductor in an atmosphere containing the Group V constituent of the semiconductor and/or its hydride.

2. Description of the Prior Art

As microelectronic technology improves, the search for better semiconductor materials becomes more intense. While past process technology has concentrated on the use of germanium and silicon for the formation of semiconductor devices, other semiconductor materials are becoming increasingly more important. Gallium arsenide (GaAs) and other zinc-blend III–V semiconductor compounds and alloys are considered to be among the most versatile of all semiconductor materials. For example, varactors, transistors, microwave diodes, light-emitting diodes, injection lasers, bulk microwave power sources, negative resistance amplifiers, and bulk-effect integrated circuits are all possible with gallium arsenide.

Although GaAs, Ge and Si all exhibit semiconducting properties, the differences between GaAs and the elemental semiconductors Ge and Si enhance gallium arsenide's potential usefulness. In GaAs, the minimum of the conduction band and the maximum of the valence band are such that direct electronic transitions can occur between the bands, allowing gallium arsenide to be used, for example, as an injection laser. This is not true for silicon or germanium.

Gallium arsenide has a higher electron mobility and a wider band gap than either germanium or silicon. Further, GaAs has two valleys in its conduction band, separated by an energy difference. Electrons in the lower-energy valley have a higher mobility than those in the higher-energy valley. As the voltage across a sample of GaAs is increased, more electrons are excited into the upper, lower-mobility valley and the current decreases, causing bulk instabilities such as the Gunn effect. This permits GaAs to be used for microwave power sources of types not possible for either silicon or germanium.

In the past, the primary obstacle to more extensive exploitation of GaAs has been its relative impurity compared with either germanium or silicon. These elemental semiconductor materials can be zone-refined in a vacuum after growth, but such purification has not been possible with GaAs. This inpurity problem has meant; e.g., that high quality transistors could not be fabricated with previously available GaAs materials.

Two methods of crystal growth, the Czochralski and the horizontal Bridgman, may be used to grow from a melt bulk single crystal GaAs of relatively high purity. However, it is widely accepted that to obtain optimum purity, device-grade gallium arsenide, growth from the vapor phase is a preferred method of growth.

In the past, several techniques have been used to grow GaAs from the vapor phase onto GaAs substrates. Two such methods are described in the article entitled "Film-Making: A Delicate Job Performed Under Pressure" by Kenneth L. Lawley, *Electronics*, Nov. 13, 1967, beginning at page 114. In one technique described therein, bulk gallium arsenide is placed in one region of a horizontal reaction chamber and heated to a temperature of about 775 C. (775 degrees Centigrade). A chlorine source gas is introduced into the chamber which reacts with vaporized gallium to form $GaCl_3$. In a central region of the chamber, at a temperature of about 850 C., the $GaCl_3$ is mixed with arsine ($AsH_3$). The mixture then is passed over a GaAs substrate situated in a third region of the chamber heated to a temperature of about 750 C. The trichloride and the arsine each dissociate and combine to form an epitaxial GaAs film on the GaAs substrate.

Another technique described by Lawley requires the presynthesis of a mixture of GaAs in liquid gallium. This presynthesis is achieved in a horizontal reaction chamber exposing liquid gallium to arsenic trichloride. If the arsenic vapor pressure exceeds the decomposition pressure of the GaAs-in-gallium solution at the operating temperature of about 850 C., a gallium arsenide skin forms on the gallium. This skin serves as the source of gallium arsenide for deposition onto a GaAs substrate located in another portion of the chamber and heated to a temperature (between 700 C. and 750 C.) lower than the temperature (800 C. to 850 C.) of the GaAs-in-gallium source.

These prior art vapor phase GaAs growth techniques suffer various shortcomings. First, the techniques all require the use of reaction chambers in which two or more regions of the chamber are heated to different, closely controlled temperatures. Such a multiple temperature requirement is difficult to implement in a production facility. Further, the prior art techniques each require use of gallium metal as a source material present in the deposition chamber. Gallium metal is difficult to obtain free of impurities because of its reactivity at high temperature with its container, and these impurities tend to vaporize in the chamber and contaminate the deposited GaAs film.

Moreover, all previous reports of successful vapor phase single crystal GaAs deposition have been on non-electrically-insulated substrates. A heteroepitaxial composite comprising a continuous film of single crystal III–V compound such as GaAs, GaP or the alloys; e.g., $GaAs_{1-x}P_x$, $Ga_{1-y}Al_yAs$, on a monocrystalline, electrically insulating substrate has not been achieved in the prior art. Such a composite is extremely valuable. For example, by producing single crystal gallium arsenide on an electrically insulating substrate, by performing appropriate device fabrication steps well known in the state-of-the-art, such as diffusion, epitaxial growth while dopant is added to the growing layer, photolithography, and other device fabrication steps, and subsequently etching away a portion of the gallium arsenide to form independent islands of the semiconductor or device structure on the insulator, it is possible; e.g., to manufacture very high density integrated circuits in gallium arsenide, while still achieving optimal electrical isolation between adjacent elements. Similarly, such an island configuration further permits electrical isolation between microwave or other components formed on adjacent GaAs islands.

In addition, at certain temperature levels some of the electrically insulating substrates; e.g., BeO and sapphire, exhibit very good thermal conductivity. Thus, a GaAs device; e.g., an amplifier, on a BeO or sapphire substrate can be operated at a wider temperature range than a device fabricated in bulk GaAs. In contrast, bulk GaAs, as a substrate material, has a low thermal conductivity which results in heating of the device and hence an increase in the noise of the amplifier. Accordingly, by fabricating the device; e.g., an amplifier, of GaAs on BeO or sapphire, the heat would be conducted away by the substrate, with concomitant decrease of noise. It is also important, when devices made from III–V material are in a high temperature environment, for the insulator to act as a heat sink and dissipate the heat either externally added or generated by the device.

The present invention provides an improved technique for depositing a film of single crystal gallium arsenide or the like epitaxially on a single crystal substrate. The substrate may be either electrically insulating or non-insulating. The technique utilizes a reaction chamber having only one high temperature zone, and permits production of single crystal films of very high purity. Furthermore, the preferred inventive technique; e.g., in the formation of GaAs, utilizes either trimethylgallium or triethylgallium, which compounds overcome the prior art limitation, expressed by Lawley (op. cit.) when he stated that, "Gallium-arsenide films are harder to grow than elemental semiconductors because there are no suitable gallium compounds that are gaseous at room temperature and atmospheric pressure."

Also, in the process of formation of the semiconductor thin film by the described process, side reactions have been substantially decreased to provide significant reduction in the impurity level. Accordingly, a level of purity and quality may be attained whereby the single crystal films that are formed may be fabricated into "Gunn-effect" devices, for example.

SUMMARY OF THE INVENTION

In accordance with the preferred embodiment of the present invention, there is provided a heteroepitaxial composite comprising a thin film of a single crystal Group III–V compound semiconductor such as GaAs, GaP, or $GaAs_{1-x}P_x$, AlAs, InAg, $Ga_{1-y}In_yAs$, $Ga_{1-y}Al_yAs$, or the like on a single crystal substrate. The substrate providing the aforementioned features and advantages may be electrically insulating, comprising; e.g., sapphire, of rhombohedral structure; spinel, thorium oxide, and gadolinium gallium garnet all of cubic structure; BeO of hexagonal structure; chrysoberyl, of orthorhombic structure; or the like.

There is further provided a novel process for producing the inventive composite, the process involving reaction of an organic compound of the semiconductor metal, typically the metal alkyl, with the hydride of the Group V constitutent of the semiconductor. In a preferred embodiment, for example, in the preparation of III–V gallium compounds or alloys, the alkyl comprises trimethylgallium (TMG) or triethylgallium (TEG) and the hydride comprises arsine, phosphine or stibine to produce the appropriate compounds or alloys: GaAs, GaP, $GaAs_{1-x}Sb_x$, $GaAs_{1-x}P_x$, . . . and $GaP_{1-x}Sb_x$.

In a preferred embodiment, the substrate is positioned in a reactor and heated to within a temperature range of about 650 C. to about 800 C. in an atmosphere of the Group V constituent provided by decomposition of the constituent hydride. In the formation of GaAs semiconductors, gaseous TMG or TEG then is introduced into the reactor to form the Group III–V compound semiconductor epitaxially on the substrate.

Thus, it is an object of the present invention to provide new epitaxial composites.

Another object of the present invention is to provide a composite comprising a single crystal Group III–V compound or alloy semiconductor film on a monocrystalline electrically insulating substrate.

Yet another object of the present invention is to provide a heteroepitaxial composite comprising a thin film of single crystal III–V semiconductor or alloy, such as GaAs, GaP, $GaAs_{1-x}P_x$, AlAs, $Ga_{1-y}Al_yAs$, InAs, $Ga_{1-y}In_yAs$, or the like on a single crystal, electrically insulating substrate, such as sapphire, spinel, BeO, or the like.

It is another object of the present invention to provide a technique for producing an epitaxial composite comprising a semiconductor or alloy thin film on a single crystal substrate.

A further object of the present invention is to provide a method for producing a semiconductor thin film from the vapor phase deposition process for formation of semiconductor thin films of higher purity for certain devices by employing a carrier gas selected from the class of inert gases such as helium and argon.

Another object of the present invention is to provide improved semiconductor thin films by providing an excess of Group V hydrides during formation in the vapor deposition process.

It is yet another object of the present invention to provide a technique for producing a thin film of III–V semiconductor or alloy by reacting alkyl gallium, aluminum, indium compounds with the hydrides of arsenic, antimony and/or phosphorus at an elevated temperature.

Yet a further object of the present invention is to provide a technique for producing a monocrystalline thin film of III–V semiconductor or alloy such as GaAs, GaP, $GaAs_{1-x}P_x$, AlAs, $Ga_{1-y}Al_yAs$ or the like from the vapor phase in a reaction chamber having only one high temperature zone.

It is yet a further object of the present invention to produce a composite heteroepitaxial structure by heating a single crystal electrically insulating substrate in a reaction chamber, and by introducing into the chamber arsine, phosphine and/or stibine, and one of the Group III alkyl compounds such as trimethylgallium, triethylgallium, trimethylaluminum, triethylaluminum, trimethylindium, and triethylindium.

Another object of the present invention is to provide multilayer thin films of different semiconductor compounds or alloys such as GaAs, AlAs, and $Ga_{1-y}Al_yAs$ on a substrate or multilayers of a compound or compounds containing different type impurities which produce p or n doped layers.

BRIEF DESCRIPTION OF THE DRAWINGS

Still other objects, features, and attendant advantages of the present invention will become apparent to those skilled in the art by the following detailed description of the preferred embodiments constructed in accordance therewith, taken in conjunction with the accompanying drawings wherein like numerals designate like parts in the several figures and wherein.

DESCRIPTION OF THE PREFERRED EMBODIMENTS

Figures 1, 2:
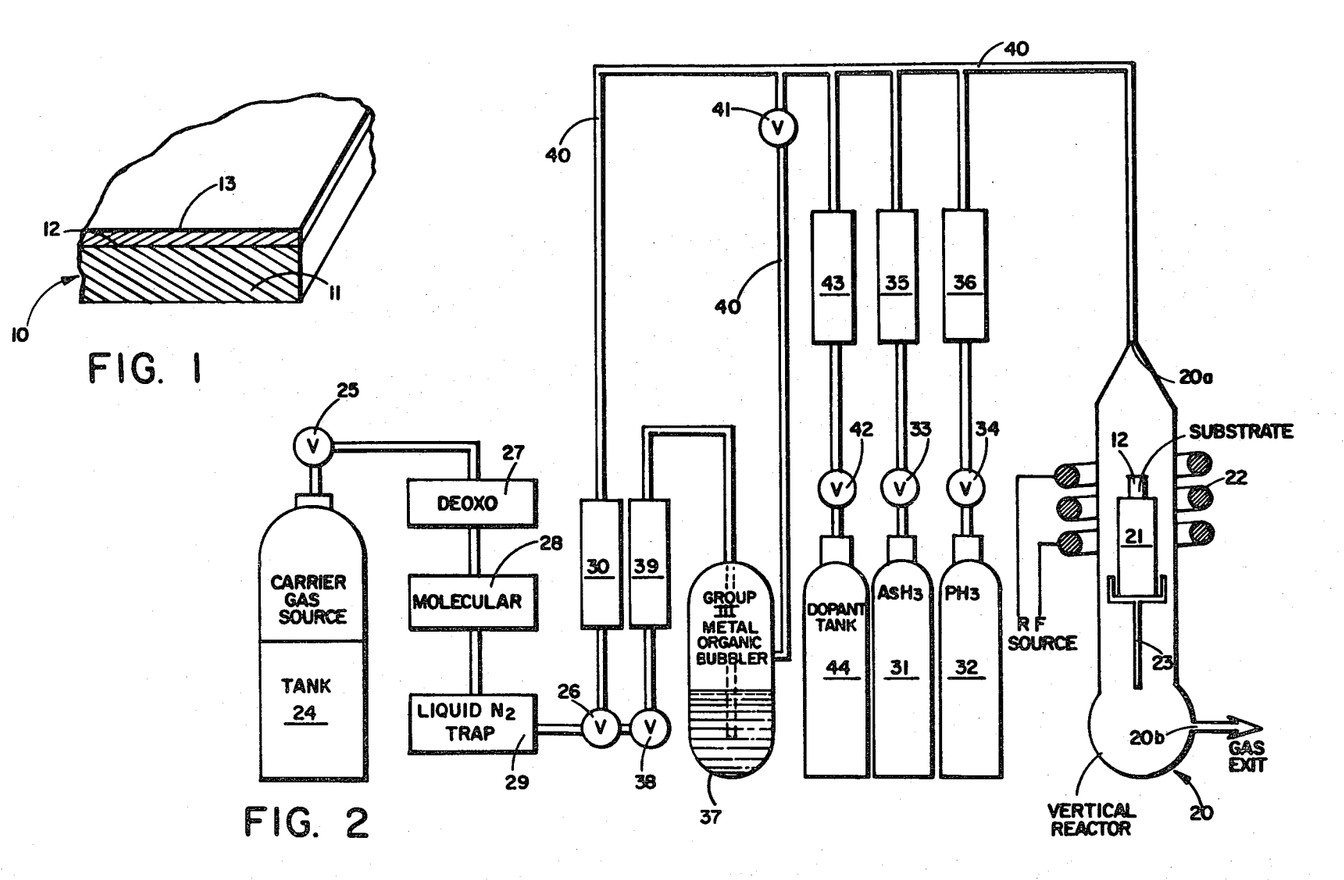
FIG. 1 is a greatly enlarged, fragmentary perspective view, in partial section, of a heteroepitaxial composite in accordance with the preferred embodiment of the present invention.
FIG. 2 is a simplified schematic diagram of an apparatus for illustrating the inventive process for producing an epitaxial III-V semiconductor thin film on a single crystal substrate.

Referring now to the drawings, and more particularly to FIG. 1, there is shown a heteroepitaxial composite 10 in accordance with the present invention. Composite 10 comprises a substrate 11 of a single crystal zinc-blende semiconductor of alloy semiconductor or single crystal, electrically insulating materials such as sapphire, spinel, BeO, ThO$_2$, GaF$_2$, CaF$_2$ or the like. Disposed atop surface 12 of substrate 11 is a thin film 13 of a monocrystalline Group III-V compound or alloy semiconductor. Preferably, thin film 13 comprises one of the gallium-V group such as gallium arsenide, gallium phosphide, or alloy compositions gallium arsenide-phosphide GaAs$_{1-x}$P$_x$ or gallium arsenide-antimonide (GaAs$_{1-x}$Sb$_x$) or the like. Other groups are the aluminum-V compound or alloy semiconductors; e.g., AlAs, AlP, AlSb, Ga$_{1-y}$Al$_y$As, Ga$_{1-y}$Al$_y$Sb and the indium-V compound or alloy semiconductor-thin films, e.g., Ga$_{1-y}$In$_y$As, InAs, or the like. Thin film 13 may also be a multilayer structure of different semiconductor compounds, or alloys such as GaAs or AlAs or Ga$_{1-y}$Al$_y$As, disposed on surface 12, or a multilayer structure of the same material containing layers of n-type doped and p-type doped; one upon the other. (In the chemical formula for the alloy, x or y represents a value between zero and one.) Composite 10, the crystallographic characteristics of which are discussed hereinbelow, may be produced in accordance with the inventive vapor phase deposition process now to be described.

Referring now to FIG. 2, there is shown an apparatus useful for practicing the inventive epitaxial deposition process. As shown therein, a vertical reactor 20 is provided with a pedestal 21 of a material, such as carbon covered by a film of silicon carbide, which can be inductively heated; e.g., by using RF heating coil 22 and an appropriate RF power source not shown. Pedestal 21 is supported axially within reactor 20, positioned so as to be heated by coil 22, by means of a suitable support 23. It should be understood, however, that the pedestal 21 can be tilted to accommodate changes in reactor shape etc. and gas flow pattern. Vertical reactor 20 is provided with an inlet 20a and an outlet 20b, the latter being connected to an appropriate gas exhaust indicated by the legend gas exit in FIG. 2. A carrier gas, typically hydrogen or helium, from tank 24 may be flowed through vertical reactor 20 by opening valves 25 and 26. As shown, the carrier, if hydrogen, may be purified by passage through a DEOXO unit 27, molecular sieves 28, and a liquid nitrogen cold trap 29, all well known in the vapor deposition art. The gas flow rate from tank 24 to reactor 20 is measured by a flow meter 30.

The system shown in FIG. 2 further comprises a pair of tanks 31 and 32 which contain respectively arsine and phosphine mixed in controlled volumetric amounts with hydrogen or an inert carrier gas. By opening valves 33 or 34 respectively, gaseous arsine or phosphine can be flowed through reactor 20. The flow rates of the arsine and phosphine are measured respectively by flow meters 35 and 36.

The metal organic compound used as a starting material in the inventive process is contained in lqiuid form in an appropriate stainless steel bubbler 37. If desired, bubbler 37 may be provided with a bath (not shown) to maintain the liquid compound at a desired temperature. Carrier gas flow into bubbler 37 is controlled by a valve 38, the flow rate being monitored by an individually regulated flow meter 39. The gas line 40 between bubbler 37 and the vertical reactor 20 may be provided with a heating jacket (not shown) when necessary to maintain the compound within line 40 in the vapor phase.

EXAMPLE I

As an illustrative example of the inventive process, the following procedure may be used to produce an epitaxial thin film 13 of gallium arsenide on a single crystal electrically insulating substrate 11 such as sapphire using arsine and trimethylgallium as the source materials.

First, the sapphire ($\alpha$-Al$_2$O$_3$) is appropriately sliced so that its deposition surface 12 exposes a known crystallographic plane; for example, the (0001) plane. Sapphire substrate 11 is positioned within vertical reactor 20 atop pedestal 21 with the deposition surface 12 facing gas inlet 20a. Initially, the carrier gas is flowed through the vertical reactor 20, by opening valves 25 and 26, to cleanse the system. A flow rate, typically on the order of 1.5 liters per minute, may be used.

The trimethylgallium (TMG) used as the Group III metal organic source material for the deposition is an alkyl compound having the chemical formula (CH$_3$)$_3$Ga. TMG exhibits a boiling point of 55.7 C. and a melting point of $-15.8$ C. Although TMG is a liquid at room temperature, better control of the vapor pressure may be obtained by maintaining the TMG in bubbler 37 at a temperature of 0° C. To accomplish this, bubbler 37 is immersed in an ice bath.

Substrate 11 is heated to a temperature of between about 650° C. and about 800° C. by means of RF induction coil 22. Maintaining substrate 11 at least above the boiling point of arsenic (boiling point=610° C. at one atmosphere) insures that pure arsenic will not deposit thereon.

Next, valve 33 is opened to permit a flow of arsine from tank 31 into vertical reactor 20. Preferably, the flow rate of arsine is adjusted to introduce into reactor 20 an excess of arsine over that stoichiometrically required for the reaction (1) given below. Typically with arsine concentration in tank 31 of about 10% in hydrogen or helium, a flow rate of about 250 cc per minute of the mixture or about 25 cc per minute of pure arsine, through flow meter 35, is appropriate for deposition.

Next, valves 38 and 41 are opened and the carrier gas is permitted to flow through bubbler 37, thereby introducing gaseous TMG into reactor 20. A typical range of flow rates for gas through the bubbler, as measured by flow meter 39, is from about 3.5 cc per minute to about 120 cc per minute.

The TMG reacts with the arsine supplied from tank 31, to produce single crystal gallium arsenide, in situ, atop heated substrate 11. Although the decomposition temperature of GaAs at one atmosphere pressure is about 625° C., a temperature below that of heated substrate 11, the GaAs film formed on substrate 11 does not decomposite due to the excess arsine pressure present in reactor 20.

In an alternative procedure, the vapors of the alkyl metal organic(s) and the hydride(s) are mixed in the proper proportions required to produce the compound and/or alloy semiconductor and decomposed at the heated pedestal at one atmosphere pressure as may be provided by a carrier gas such as He or $H_2$, or under a reduced pressure, as might be provided by the pure reactants without the use of a carrier gas.

The metal organic compounds and the hydrides, which are not diluted by a carrier gas and are under their own vapor pressures, are mixed either before or in the reaction chamber, depending upon their mutual chemical reactivity at room temperature, and decomposed on the heated substrate. For example, the amounts of material to be reacted may be adequately controlled by flowmeters placed between the reactant materials and a vacuum environment in the reactor portion; for example, as provided by evacuation of the vertical reactor via the gas exit.

While a free radical mechanism can be written to explain the formation of GaAs from TMG and $AsH_3$, it is also possible that the controlling reaction is the following:

$$(CH_3)_3Ga + AsH_3 \rightarrow GaAs + 3CH_4 \qquad (1)$$

From this equation (1), the stoichiometric amount of arsine required to produce GaAs from a given amount of TMG may be calculated.

A similar technique is used to grow an epitaxial gallium arsenide film 13 from triethylgallium (TEG), which source material has the chemical formula $(C_2H_5)_3Ga$, and exhibits a boiling point of 143° C. Since the boiling point of TEG is higher than that of TMG, sufficient vapor is better obtained if the TEG is kept in liquid form in bubbler 37 at room temperature or above. However, it often is desirable to heat line 40 between bubbler 37 and reactor 20 to maintain the TEG in the vapor phase as it is being transported to reactor 20. The process reaction may be described by the equation:

$$(C_2H_5)_3Ga + AsH_3 \rightarrow GaAs + 3C_2H_6 \qquad (2)$$

The stoichiometrically required amount of arsine, for a preselected amount of TEG, may be calculated from this equation (2).

As noted earlier, the arsine initially is preferably introduced into vertical reactor 20 at a flow rate adjusted to provide an excess of arsine over that stoichiometrically required for reaction (2). The TEG then is introduced into the chamber in flowing carrier gas. Gallium arsenide is formed in situ on substrate 11 which has been heated to a temperature range of between about 650° C. and about 800° C.

By substituting phosphine for arsine, the inventive process may be used to produce an epitaxial film of GaP. Since the equilibrium vapor pressure of phosphorus over GaP is greater than that of arsenic over GaAs, there is a tendency to lose phosphorus in the deposition reaction at a faster rate than arsenic is lost when growing GaAs films. For this reason, it is desirable to use a greater excess of phosphine over that stoichiometrically required than that excess required for arsine when forming GaAs. This considerable excess phosphine increases the effective pressure at the surface 12 on which film 13 is being formed.

The formation of the Group III-V alloys, for example, $GaAs_{1-x}Sb_x$, can be accomplished by mixing stibine ($SbH_3$) with $AsH_3$ in the appropriate proportions and reacting the gas mixture with TMG at the heated pedestal to form the $GaAs_{1-x}Sb_x$.

If desired, a III-V semiconductor or alloy epitaxial film may be doped during formation. To accomplish this, during film deposition a controlled amount of an appropriate dopant is introduced in the gas phase into reactor 20, via valve 42 and flow meter 43, from a container 44 (see FIG. 2). If an n-type semiconductor film 13 is desired, selenium (Se) or sulphur (S), for example, may be introduced in the present process in the form of $H_2Se$ or $H_2S$, which gaseous hydride would be contained in container 44 in pure or diluted form. In the reactor, the elevated temperature causes dissociation of the controlled amount of hydride to provide dopant for the thin film, and hydrogen. If an acceptor dopant is desired to provide a p-type semiconductor film 13, a suitable compound such as dimethylzinc, $(CH_3)_2Zn$, diethylzinc (DEZ), $(C_2H_5)_2Zn$, or dimethylcadmium may be provided in container 45. Dissociation of these compounds provides a zinc or cadmium dopant, respectively, and an organic by-product which is exhausted from the system by the carrier gas flow.

A film 13 of mixed alloy; for example, $GaAs_{1-x}P_x$ (where x may take any value between zero and one) also may be grown using the inventive process described herein-above. In this example, both arsine and phosphine are introduced into vertical reactor 20 during the deposition, by opening both of valves 33 and 34. The arsenic/phosphorus ratio may be altered by controlling the relative proportions of arsine and phosphine introduced into the deposition chamber. The resultant film 13 in this example comprises a solid solution of gallium arsenide-phosphine, and is formed epitaxially atop substrate 11.

The inventive process described herein-above has been used to grow GaAs, GaP, GaSb, $GaAs_{1-x}P_x$, $GaAs_{1-x}Sb_x$, AlAs, $Ga_{1-y}Al_yAs$, In As, and the like, single crystal films 13 epitaxially on a number of single crystal electrically insulating substrate 11 and on GaAs and the like. These electrically insulating substrates have included sapphire ($\alpha$-$Al_2O_3$), spinel ($MgAl_2O_4$), beryllium oxide (BeO), thorium oxide ($ThO_2$), gadolinium gallium garnet ($Gd_3Ga_5O_{12}$), chrysoberyl ($Al_2BeO_4$), calcium fluoride ($CaF_2$), and barium fluoride ($BaF_2$). In the latter two cases, $CaF_2$ and $BaF_2$, flaking of the deposited films was noted, possibly resulting from the difference in coefficient of thermal expansion between these substrates and the noted semiconductors. However, with the other substrates listed, excellent large area thin films were achieved. In each case, epitaxy was verified by X-ray and reflection electron diffraction studies. In addition, photographs of the surface microstructure of thin film 13 helped to identify the films as single crystal; for example, the photograph of FIG. 3.

For GaAs films, the crystallographic orientations between substrate 11 and film 13 have been determined for various single crystal, electrically insulating substrate materials and substrate orientations. The following table sets forth some of the orientation relationships which have been observed.

TABLE I

Orientation Relationships Between Heteroepitaxial GaAs and Single Crystal, Electrically Insulating Substrates

| Substrate Plane | Parallel Relationships |
|---|---|
| (0001) $Al_2O_3$ | (111) GaAs ∥ (0001) $Al_2O_3$ |
| (11$\bar{2}$3) $Al_2O_3$ | (111) GaAs ∥ (11$\bar{2}$3) $Al_2O_3$ |
| (11$\bar{2}$5) $Al_2O_3$ | (111) GaAs ∥ (11$\bar{2}$5) $Al_2O_3$ |
| (01$\bar{1}$2) $Al_2O_3$ | (111) GaAs ∥ (01$\bar{1}$2) $Al_2O_3$ |
| (11$\bar{2}$6) $Al_2O_3$ | (111) GaAs ∥ (11$\bar{2}$6) $Al_2O_3$ |
| ABOUT 10° from (01$\bar{1}$2) $Al_2O_3$ | (110) GaAs ∥ (01$\bar{1}$2) $Al_2O_3$ |
| (100) $MgAl_2O_4$ | (100) GaAs ∥ (100) $MgAl_2O_4$ |
| (110) $MgAl_2O_4$ | (100) GaAs ∥ (110) $MgAl_2O_4$ |
| (111) $MgAl_2O_4$ | (111) GaAs ∥ (111) $MgAl_2O_4$ |
| (10$\bar{1}$1) BeO | (111) GaAs ∥ (10$\bar{1}$1) BeO |
| (0001) BeO | (111) GaAs ∥ (0001) BeO |
| (10$\bar{1}$0) BeO | (100) GaAs ∥ (10$\bar{1}$0) BeO |
| (100) $ThO_2$ | (100) GaAs ∥ (100) $ThO_2$ |
| (211) $Gd_3Ga_5O_{12}$ | (111) GaAs ∥ (211) $Gd_3Ga_3O_{12}$ |

Figure 3:
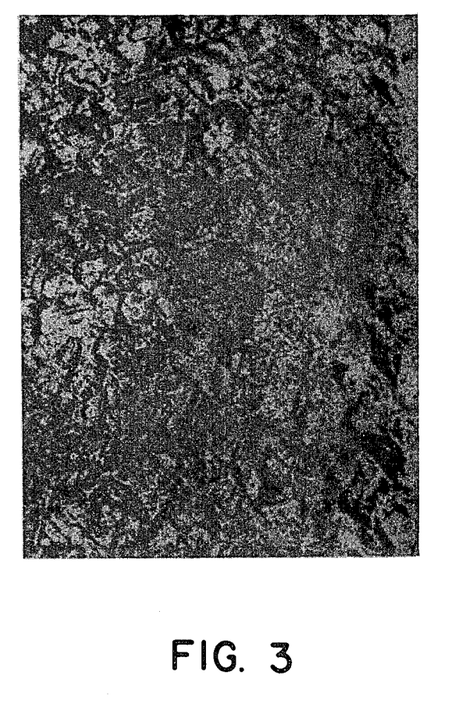
FIG. 3 is a photomicrograph showing the surface characteristics of a thin film of monocrystalline (111) gallium arsenide prepared in accordance with the present invention on a single crystal electrically insulating substrate of spinel.

FIG. 3 is a photograph showing the surface microstructure of a GaAs film grown epitaxially on spinel ($MgAl_2O_4$) using the inventive process described hereinabove. In the specimen illustrated, the GaAs film has its (111) crystallographic plane parallel to the (111) crystallographic plane of the substrate. The triangular growth features evident in FIG. 3 suggest (111) oriented GaAs. X-ray diffraction examination of the same specimen produced Laue patterns consistent with (111) GaAs growth parallel to the (111) plane of spinel.

The inventive process described hereinabove also has been used to grow epitaxial thin films of Group III-V compound and alloy semiconductors on various single crystal, non-electrically-insulating substrates including, but not limited to, SiC, GaAs, GaP and Ge. In each case, the process steps corresponded substantially to those employed to deposit GaAs, GaP, $GaAs_{1-x}P_x$, $GaAs_{1-x}Sb_x$, $Ga_{1-y}Al_yAs$, and the like on electrically insulating substrates.

It will be understood that various modifications of the herein described process also are considered within the scope of the present invention. For example, after initial nucleation of a GaAs film 13, very small controlled amounts of gaseous $AsCl_3$ and/or HCl may be introduced into reaction chamber 20 together with the arsine and gallium sources. If $AsCl_3$ is used, it dissociates to form HCl in the hydrogen atmosphere. The HCl tends preferentially to etch away or remove some defects in the growing GaAs, thereby providing a more defect-free film 13.

It has also been found beneficial to anneal a film after complete coverage has been achieved, as this removes many defects associated with the growth at the heterogeneous interface. Annealing after a thicker film has been grown has also been found to be beneficial in improving quality.

Further, while exemplary deposition temperatures have been set forth hereinabove, these are not to be considered limiting. For example, growth of GaAs at deposition temperatures above 800° C. may be employed, but there may be some sacrifice in growth rate and possibly film quality.

While the examples above have involved the growth of semiconductor films having As or P as the Group V constituent, the invention is not so limited. Thus as described, films having antimony as a Group V constituent also may be made using the inventive process; for example, by substituting stibine ($SBH_3$) for the arsine or phosphine as discussed supra. The high boiling point of Sb as compared to As or P requires much more careful control of the $SbH_3$ concentration in the growth process.

In another embodiment, the inventive process may be used to produce Group III-V compound semiconductor thin films wherein the Group III constituent comprises indium or aluminum. Thus; for example, an organic alkyl compound of In or Al may be introduced into reactor 20 in the gas phase. This organic compound reacts; e.g., with the hydride of arsenic, phosphorus or antimony to produce on heating InAs, InP, InSb, AlAs, AlP, AlSb, or the like. If the organic compound selected is one which reacts at room temperature with the hydride to form stable intermediate products, it may be desirable to use separate flow lines into reactor 20 for the organic and for the hydride. Preferably, at least one of the flow lines should terminate near the heated substrate.

EXAMPLE II - PREPARATION OF ALUMINUM ARSENIDE (AlAs)

By substituting trimethylaluminum (TMA) for trimethylgallium (TMG) in the process described in Example I, and reacting TMA with $AsH_3$ at the heated pedestal, a single crystal film of aluminum arsenide (AlAs) is produced on a single crystal substrate such as sapphire, spinel, beryllium oxide, chrysoberyl, gallium arsenide, and germanium. An exemplary set of conditions for film growth is the following: temperature of pedestal, 700° C.; $AsH_3$ (10%) in carrier gas (e.g., $H_2$ or He) at a flow rate of 90 cc per minute into the reactor for about 2 minutes prior to introduction of TMA and then together with TMA carried by 50 cc per minute of carrier gas which had been bubbled through the liquid TMA at room temperature. After 15 minutes of growth, approximately 4 μm of AlAs will have been grown, noticeably an orange film, transparent as seen through a transparent single crystal inorganic oxide substrate.

The inventive process also may be used to produce Group III-V compound semiconductor thin films wherein the Group III constituent comprises an alloy. For example, by introducing organic compounds of In and Ga, Al and Ga, or In and Al into reactor 20 together with a Group V hydride, alloy semiconductors such as $Ga_{1-y}In_yAs$; $Ga_{1-y}In_yP$; $Ga_{1-y}Al_yP$; $Ga_{1-y}Al_yAs$; $In_{1-y}Al_yP$; $In_{1-y}Al_yAs$ or the like will form on reaction at an elevated temperature. (In each case, y assumes a value between zero and one.) Of course, such systems also can be combined with mixtures of the Group V constituents to form such alloys as: $Ga_{1-y}In_yAs_{1-x}P_x$; $Ga_{1-y}Al_yAs_{1-x}P_x$; $In_{1-y}Al_yAs_{1-x}P_x$ or the like or $(GaAlIn)_a(AsPSb)_b$, where a and b=1.

EXAMPLE III—PREPARATION OF $Ga_xAl_{1-x}As$, AN EXAMPLE OF ALLOY FORMATION

Of the mixed III-V alloys, $Ga_xAl_{1-x}As$ can be prepared by reacting $AsH_3$ with mixtures of TMG and TMA. The composition of the mixture can be changed by adjusting the rates of flow of the carrier gas through the liquid alkyl compounds and then mixing the gases prior to their introduction into the reactor, where reaction with arsine takes place to produce the alloy. The alloy formed is graded in composition; for example, by varying the TMG of TMA concentration during film growth by adjusting the carrier gas flows.

An alternate process for alloy growth of a desired composite would be to mix appropriate amounts of the liquid TMA and TMG together in a bubbler and use a carrier gas such as $H_2$ or He to transfer predetermined amounts of the alkyls to the reaction zone.

As an alternative to use of the hydride to supply the Group V constituent of the compound semiconductor, in some instances an organic component of the Group V constituent may be used. Examples of such a component include trimethylstibine, $(CH_3)_3Sb$, and trimethylarsine, $(CH_3)_3As$, and trimethylphosphine, $(CH_3)_3P$.

The exemplary set of conditions for alloy growth by the alternate process is the following: pedestal temperature, 700° C.; total carrier gas flow 1.5 liters/minute; carrier flow, through TMG at 0° C., 10 cc per minute; carrier flow through TMA of 15 cc per minute; and flow of $AsH_3$ (10% in carrier) at a rate of 90 cc per minute in the reactor during growth and also about 2 minutes before introduction of the TMG and TMA into the reactor. These growth conditions produced a single crystal alloy with composition $Ga_{0.5}Al_{0.5}As$ on $Al_2O_3$ and GaAs, for example.

Although the invention has been described and illustrated in detail, it is to be clearly understood that the same is by way of illustration and example only and is not to be taken by way of limitation, the spirit and scope of this invention being limited only by the terms of the appended claims.

What is claimed is:

1. An organo-metallic process for producing an epitaxial film of Group III-V semiconductor disposed on a single crystal substrate, said process employing an open reactor and comprising the steps of:
   heating said substrate in said open reactor,
   introducing into said open reactor a fist material containing a hydride or halide-free alkyl compound of at least one Group V constituent of said semiconductor, and, as a second material, at least one halide-free alkyl compound containing at least one of the Group III constituents of said semiconductor, and
   exhausting said open reactor to pressure not greater than one atmosphere.

2. A process for producing an epitaxial film of a Group III-V semiconductor disposed on a single crystal substrate, said process employing an open reactor having exterior walls defining an interior chamber and comprising the steps of:
   providing a single heated zone within said interior chamber of said open reactor without substantially heating said exterior walls of said reactor,
   heating said substrate in said single, heated zone of said interior chamber of said open reactor, and
   introducing into said reactor a first halide-free material containing at least one Group V constituent of said semiconductor, and, as a second material, at least one halide-free organic alkyl compound containing at least one of the Group III constituents of said semiconductor, and
   exhausting said open reactor to a pressure not greater than one atmosphere.

3. An organo-metallic process for producing an epitaxial film of a Group III-V semiconductor directly on a single crystal substrate, said process comprising the steps of:
   providing a first material containing a hydride or alkyl of at least one Group V constituent of said semiconductor,
   providing a second, metal-organic source material comprising at least one organic alkyl compound containing at least one of the Group III constituents of said semiconductor,
   disposing said substrate in an open reactor,
   providing a controlled, elevated temperature zone within only the interior of said reactor for heating said substrate to a required temperature for deposition of said film thereon,
   introducing said first and second materials into said reactor and heating said substrate in accordance with said controlled temperature zone to effect the deposition of an epitaxial film of the Group III-V semiconductor on said substrate.

4. The process according to claim 1 in which a single heated zone is provided in the interior of the reactor without substantially heating said reactor.

5. The process according to claim 1 in which said first and second materials are introduced under reduced pressure conditions in the reactor and the source of the constituents consists of substantially pure forms of said materials.

6. The process according to claim 1, 2, or 3 in which said materials are introduced in flowing hydrogen.

7. The process according to claim 1, 2, or 3 in which said materials are introduced in flowing nitrogen.

8. The process according to claim 1 in which said first material comprises a hydride.

9. The process according to claim 1 in which at least one of said alkyl compounds comprises more than one alkyl.

10. The process according to claim 1 in which the first material comprises more than one alkyl compound containing a Group V constituent.

11. The process according to claim 1 in which said semiconductor comprises gallium arsenide, said first material comprises arsine, said second material is selected from the class consisting of trimethylgallium and triethylgallium, and said process is carried out in a hydrogen atmosphere.

12. The process according to claim 1 in which said semiconductor comprises gallium arsenide, said first compound comprises arsine, said second material is selected from the class consisting of trimethylgallium and triethylgallium, and said process is carried out in a nitrogen atmosphere.

13. The process according to claim 1 in which said semiconductor comprises gallium phosphide, said first compound comprises phosphine, said second material is selected from the class consisting of trimethylgallium and triethylgallium, and said process is carried out in a hydrogen atmosphere.

14. The process according to claim 1 in which said semiconductor comprises gallium phosphide, said first material comprises phosphine, said second material is selected from the class consisting of trimethylgallium and triethylgallium, and said process is carried out in a nitrogen atmosphere.

15. The process according to claim 1 in which said Group III constituent is selected from the class consisting of gallium, aluminum, indium and combinations of more than one thereof.

16. The process according to claim 1 further comprising: introducing a dopant-containing gas in said reactor.

17. The process according to claim 1 in which said first material is introduced before introducing said second material.

18. The process according to claim 17 in which said first material comprises a hydride and wherein said second material comprises at least one alkyl.

19. The process according to claim 18 in which said second material is selected from the class consisting of trimethylgallium and triethylgallium; trimethylaluminum and triethylaluminum; trimethylindium and triethylindium.

20. The process according to claim 17 further comprising: providing a small amount of gas phase etchant in said reactor.

21. The process according to claim 20 in which said etchant comprises hydrogen halide.

22. The process according to claim 20 in which said Group V constituent comprises arsenic and said etchant is provided from arsenic halide and hydrogen.

23. The process according to claim 20 in which said Group V constituent comprises phosphorus and said etchant is provided from a phosphorus halide and hydrogen.

24. The process according to claim 1 in which the amount of said first material introduced exceeds that stoichiometrically required to form said film.

25. The process according to claim 24 in which the first material comprises more than one of the alkyls including the Group V constituent.

26. The process according to claim 1 in which said compounds are introduced in flowing inert gas.

27. The process according to claim 26 in which said inert gas is one selected from the group consisting of helium and argon.

28. The process according to claim 1 in which said first material comprises a hydride and wherein said second material comprises more than one alkyl compound.

29. The process according to claim 28 in which at least one of said more than one alkyl compound comprising said second material is selected from the class consisting of trimethylgallium and triethylgallium; trimethylaluminum and triethylaluminum; trimethylindium and triethylindium.

30. The process according to claim 29 in which said hydride is selected from the class consisting of arsine, phosphine and stibine.

31. The process according to claim 1 in which said semiconductor comprises gallium arsenide, said first material comprises arsine, and said second material is selected from the class consisting of trimethylgallium and triethylgallium and said process is carried out in an atmosphere of inert gas.

32. The process of claim 31 in which said inert gas is helium or argon.

33. The process according to claim 1 in which said semiconductor comprises gallium phosphide, said first material comprises phosphine, said second material is selected from the class consisting of trimethylgallium and triethylgallium, and said process is carried out in an inert gas atmosphere.

34. The process of claim 33 in which said inert gas is helium or argon.

35. The process according to claim 1 in which said semiconductor is selected from a group consisting of III-V semiconductor alloys containing at least one of the Group III constituents Ga, Al and In and at least one of the Group V constituents As, P, and Sb.

36. The process according to claim 35 in which said second material is selected from a group of trialkyl Ga, Al, or In compounds and said process is carried out in an atmosphere selected from the class consisting of hydrogen, nitrogen, and helium.

37. The process according to claim 35 in which the composition of the Group V constituent is controlled by adjusting the relative concentration of more than one of the group consisting of arsine, phosphine and stibine in said reactor.

38. The process according to claim 1 in which said single crystal substrate is non-electrically insulating.

39. The process according to claim 38, 2 or 3 in which said single crystal substrate is a semiconductor.

40. The process according to claim 38, 2 or 3 in which the substrate is germanium.

41. The process according to claim 39 in which the substrate is silicon carbide.

42. The process according to claim 39 in which said substrate possesses a zinc blend structure.

43. The process according to claim 42 in which said substrate is selected from the class consisting of III-V semiconductors and semiconductor alloys.

44. The process according to claim 43 in which said substrate is selected from the class of III-V semiconductors consisting of GaAs, GaP, GaSb, AlAS, AlP. AlSb, InAs, InP, and InSb.

45. The process according to claim 43 in which said substrate is selected from a group consisting of III-V semiconductor alloys containing at least one of the Group III constituents Ga, Al or In and at least one of the Group III constituents As, P or Sb.

46. The process according to claim 1 in which said single crystal substrate is electrically insulating.

47. The process according to claim 46 in which said substrate is selected from the class consisting of sapphire, spinel, chrysoberyl, beryllium oxide, thorium oxide, calcium fluoride, barium fluoride and gadolinium gallium garnet.

48. The process according to claim 1 in which said Group V constituent is selected from the class consisting of arsenic, phosphorus, antimony and combinations of more than one thereof.

49. The process according to claim 48 in which said Group III constituent is selected from a class consisting of In, Ga, Al and mixtures of more than one thereof.

50. The process according to claim 1, 4 or 2 in which the single heated zone is about 650° C. to about 800° C.

51. A process according to claim 1, 4 or 2, further comprising the step of:
controlling the introduction of said first and second materials into said open reactor to maintain a pressure therewithin of less than one atmosphere.

52. A process according to claim 1, 4 or 2, further comprising the step of:
evacuating said open reactor to maintain a reduced pressure of less than one atmosphere therewithin.

53. A process for producing an epitaxial film of a Group III-V semiconductor disposed on a single crystal sapphire (α-aluminum oxide) substrate which process comprises:
heating a substrate in a reactor with the orientation of the exposed surfaces of the substrate being the (0001), (११२̄३), (०११̄२), (११२̄५), or (११२̄६) crystallographic plane or being about 10° from the (०११̄२) crystallographic plane and introducing into the reactor one or more gaseous hydrides or alkyls of As, Sb and P as Group V constituent and one or more gaseous alkyls of Ga, Al or In as Group III constituent.

54. A process for producing an epitaxial film of a Group III–V semiconductor disposed on a single crystal spinel substrate, which process comprises heating the substrate in a reactor with the orientation of the exposed surface of the substrate being the (110) crystallographic plane, and introducing into the reactor one or more gaseous hydrides or alkyls of As, Sb and P as Group V constituent, and one or more gaseous alkyls of Ga, Al or In as Group III constituent of the semiconductor, the (100) crystallographic plane of the film thereby deposited being parallel to the exposed plane of the spinel.

55. A process according to claim 1, 2, 53 or 54 in which all of said materials, constituent compounds, hydrides and alkyls are introduced under reduced pressure.

56. A process according to claim 1, 2, 53 or 54 in which the Group V constituent hydride or alkyl is introduced into the reactor before the alkyl compound of the Group III constituent.

57. A process according to claim 1, 2, 53 or 54 in which the amount of the Group V constituent hydride or alkyl introduced exceeds that stoichiometrically required to form the said film.

58. A process according to claim 1, 2, 53 or 54 in which alkyl compounds of more than one of the Group V constituents are introduced into the reactor.

59. A process according to claim 1, 2, 53 or 54 in which the Ga, Al and In alkyl compounds are trimethylgallium or triethylgallium; trimethylaluminum or triethylaluminum; trimethylindium or triethylindium.

60. A process according to claim 1, 2, 53 or 54 in which the concentration of the Group V constituent is controlled by adjusting the relative concentration of more than one of arsine, phosphine and stibine present in the reactor.

61. A process according to claim 1, 2, 53 or 54 in which the constituent compounds are introduced in flowing Group O gas.

62. A process according to claim 1, 2, 53 or 54 in which the Group O gas is helium or argon.

63. A process according to any of claims 1, 2, 53 or 54 in which the constituent compounds are introduced in flowing nitrogen.

64. A process according to any of claims 1, 2, 53 or 54 in which the constituent compounds are introduced in flowing hydrogen.

65. A process as recited in claim 3 wherein there is provided a single controlled, elevated temperature zone in said reactor.

66. A process as recited in claim 3 or 65 wherein said substrate is heated to a temperature of from about 650° C. to about 800° C. in said controlled, elevated temperature zone.

67. A process as recited in claim 3 or 65 wherein said substrate comprises an electrically insulating material.

68. A process as recited in claim 3 or 65, performed in the absence of any halide material in said reactor.

69. A process as recited in claim 3 or 65, further comprising:
providing a mixture of said first and second materials in the gaseous phases thereof within said temperature zone of said reactor with the amount of said first material introduced being in excess of that stoichiometrically required to form said film.

70. A process as recited in claim 3, further including:
providing an inert gaseous atmosphere in said reactor.

71. A process as recited in claim 3, 65 or 70, wherein the step of introducing said materials comprises:
introducing said first material at or prior to the time said substrate reaches the required temperature for achieving deposition, and
introducing said metal-organic source material subsequently to said substrate being heated to said required temperature for deposition.

72. A process as recited in claim 3, 65 or 70, wherein the step of introducing said materials comprises:
introducing said first material at or prior to the time said substrate reaches the required temperature for achieving deposition, and
introducing said metal-organic source material subsequently to said substrate being heated to said required temperature for deposition, and
introducing an amount of said first material in excess of that stoichiometrically required to form said film.

* * * * *